(12) United States Patent
Shoji

(10) Patent No.: US 8,004,064 B2
(45) Date of Patent: Aug. 23, 2011

(54) THIN FILM CAPACITOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 58 days.

(21) Appl. No.: 12/078,021

(22) Filed: Mar. 26, 2008

(65) Prior Publication Data

US 2008/0237794 A1    Oct. 2, 2008

(30) Foreign Application Priority Data

Mar. 30, 2007   (JP) .................... 2007-093735

(51) Int. Cl.
*H01L 21/02* (2006.01)
(52) U.S. Cl. ............ 257/532; 257/534; 257/E21.008
(58) Field of Classification Search .......... 257/532, 257/E21.008
See application file for complete search history.

(56) References Cited

U.S. PATENT DOCUMENTS

| | | | | |
|---|---|---|---|---|
| 6,387,750 B1 * | 5/2002 | Lai et al. | | 438/250 |
| 6,646,323 B2 * | 11/2003 | Dirnecker et al. | | 257/532 |
| 6,825,080 B1 * | 11/2004 | Hu et al. | | 438/250 |
| 7,259,516 B2 * | 8/2007 | Wan et al. | | 313/582 |
| 7,544,986 B2 * | 6/2009 | Rasmussen | | 257/306 |
| 2006/0194348 A1 * | 8/2006 | Araujo et al. | | 438/3 |
| 2007/0253143 A1 * | 11/2007 | Goldberger et al. | | 361/306.1 |

FOREIGN PATENT DOCUMENTS

JP    A 6-325970    11/1994

* cited by examiner

*Primary Examiner* — Ken A Parker
*Assistant Examiner* — David Spalla
(74) *Attorney, Agent, or Firm* — Oliff & Berridge, PLC

(57) ABSTRACT

A thin film capacitor with a trench structure having a base substance and a pair of electrodes provided on the base substance, and a dielectrode provided between the electrodes. The trench pattern is configured to have a first pattern and a second pattern separate from the first pattern. The first pattern having a plurality of protrusions provided upright at predetermined intervals, and the second pattern separate from the first pattern having a plurality of recesses provided at predetermined intervals, are provided at the side of the base substance where the dielectric film is formed. Trenches are each defined by the outer wall of each protrusion and the inner wall of each recess.

8 Claims, 14 Drawing Sheets

THIN FILM CAPACITOR

BACKGROUND OF THE INVENTION

The present invention relates to a thin film capacitor, and, particularly, to a trench type thin film capacitor.

Multifarious surface-mounted type electronic parts are mounted in an internal circuit of an electronic device, such as a computer or a portable terminal. Recently, it is a prime task to make multifarious electronic parts smaller and thinner (thinner films), regardless of whether they are active devices or passive devices, to meet a demand of higher performances and smaller sizes of electronic devices. Some examples of such thin film electronic parts are a thin film capacitor, a thin film inductor, a thin film LC composite part, a thin film lumped parameter device, a thin film distributed parameter device, and a thin film stacked composite part, which are fabricated by using a thin film forming process.

As one scheme of achieving down-sizing and flattening of a thin film capacitor among such thin film electronic devices while increasing the capacitance of the thin film capacitor per unit volume (volumetric capacity) thereof, a method of forming a trench (stepped base structure) at the base substance and forming a thin film capacitor in that trench has been proposed (see Japanese Patent Application Laid-Open No. H06-325970). Since this method increases the surface area of the electrodes of the thin film capacitor as compared with a case of forming a thin film capacitor on a smooth base substance, the capacitance can be made larger.

In principles such a trench type thin film capacitor can increase the electrode surface area per unit area by increasing the aspect ratio of the trench (AR: depth/width), thereby further increasing the capacitance of the capacitor. To make uniform the capacitance of the thin film capacitor between adjoining trenches or in the base substance, such as a wafer, or a substrate surface (hereinafter, collectively called "in the base substance surface" or "in the substrate surface"), it is demanded to make the electrode surface area or the thin film capacitor uniform. This requires that in the case of a trench type thin film capacitor, the area of a side surface which is expressed by the product of the circumferential length of the trench and the height thereof should be made uniform.

In general, typical methods of forming a trench include a method of forming a trench on a metal base substance to be an electrode using a dicing saw, an electron beam or the like as described in the aforementioned Japanese Patent Application Laid-Open No. H06-325970, a method of forming a resist having a trench pattern on a base substance to be an electrode and forming a trench by dry etching or wet etching with the resist used as a mask (subtractive method), and a method of forming a resist with a desired pattern on a base substance and forming (depositing) an additional layer on the base substance at a region other than the resist (additive method). From the viewpoint of securing work precision and shape stability in micropatterning to suppress a change in capacitance, trench formation using the subtractive method and additive method is preferable.

In the subtractive method to form a trench by etching, however, side etching occurs inevitably. Because there is a limit in suppressing a change in the amount of side etching in the base substance surface, the circumferential length of the trench varies within the base substance surface. This scheme tends to make a side-etching oriented change in circumferential length more noticeable as the aspect ratio of the trench becomes higher.

While the additive method can acquire a trench as defined by the size of openings in a patterned resist, the dimensions of the resist pattern itself may vary due to the influence of the lithography process and the developing process. Therefore, the change in the dimensions of the resist pattern in the base substance surface reflects on the trench, causing a change in the circumferential length of the trench in the base substance surface.

As apparent from the above, both of the subtractive method and the additive method have a difficulty in completely eliminating a change in the circumferential length of the trench in the base substance surface. This raises a problem that the change in circumferential length varies (makes non-uniform) the capacitance of the thin film capacitor in the base substance surface.

Accordingly, the present invention has been made in view of the foregoing situation, and it is an object of the invention to provide a thin film capacitor which can improve the uniformity of the capacitance while keeping a high capacitance.

SUMMARY OF THE INVENTION

To achieve the object, a thin film capacitor according to the invention comprises a base substance; a pair of electrodes provided on the base substance; a dielectric film provided between the pair of electrodes; a first pattern having at least one protrusion provided at that side of the base substance where the dielectric film is formed; and a second pattern provided at separately from the first pattern and having at least one recess provided at that side of the base substance where the dielectric film is formed. In other words, the first pattern is an aggregation of one or more protrusions separate from each other or not, the second pattern is an aggregation of one or more recesses separate from each other or not, and the first pattern and the second pattern may overlie each other partially or entirely in a planar view, as long as the patterns are separate from each other without being connected each other.

With such a configuration, the protrusion of the first pattern and the recess of the second pattern constitute a trench type thin film capacitor. That is, a trench is defined by the outer wall of the protrusion of the first pattern and/or the inner wall of the recess of the second pattern.

Here, the first pattern and the second pattern can both be formed by the method of etching a base substance using a resist pattern (subtractive method) or the method of forming an additional layer on a base substance using a resist pattern (additive method), or the combination of both methods (e.g., semi-additive method).

When the subtractive method of etching a base substance is used, for example, etching of the outer wall of the protrusion progresses inward from outward in the first pattern, and etching of the inner wall of the recess progresses outward from inward in the second pattern. As etching progresses, therefore, the outer shape of the protrusion of the first pattern becomes smaller and the inner shape of the recess of the second pattern becomes larger, so that the spatial shape of the trench increases. Accordingly, even when the amount (rate) of side etching changes (increases or decreases), an increase or decrease in the circumferential length of the protrusion of the first pattern is canceled out with a decrease or increase in the circumferential length of the recess of the second pattern, thus resulting in the suppression of a change in the total circumferential length of the first pattern and the second pattern (i.e., the entire inner circumferential length of the trench).

When the additive method of forming an additional layer on a base substance is used, for example, a resist pattern comprising an inverted pattern of the first pattern (i.e., the protrusion of the first pattern is open) is formed, a resist pattern comprising an inverted pattern of the second pattern (i.e., the recess of the second pattern protrudes) is formed, and a layer is formed on a region other than the resists to form a first pattern having a protrusion and a second pattern having a recess. When the size of the opening in the resist becomes wider at this time, for example, the outer shape of the protrusion of the first pattern becomes larger while the inner shape of the recess of the second pattern becomes smaller, so that even if the size of the opening in the resist pattern increases or decreases, an increase or decrease in the circumferential length of the protrusion of the first pattern is canceled out with a decrease or increase in the circumferential length of the recess or the second pattern. This results in the suppression of a change in the total circumferential length of the first pattern and the second pattern (the inner circumferential length of the trench). In the additive method, an insulating layer or a metal layer may be used instead of a resist.

It is preferable that the number of the protrusions of the first pattern should be equal to the number of the recesses of the second pattern. Accordingly, an increase or decrease in the circumferential length of the protrusion of the first pattern can surely be canceled out with a decrease or increase in the circumferential length of the recess of the second pattern, thus further suppressing a change in the total circumferential length of the first pattern and the second pattern (the entire inner circumferential length of the trench).

In this case, it is preferable that the height of the protrusions of the first pattern should be approximately equal to the depth of the recesses of the second pattern. Accordingly, if the amount of an increase or decrease in the circumferential length of the protrusion of the first pattern is approximately equal to the amount of a decrease or increase in the circumferential length of the recess of the second pattern, a change in electrode surface area which is determined by the product of the circumferential length of the trench and the height thereof is suppressed sufficiently.

It is more preferable that the protrusion of the first pattern should be arranged in the recess of the second pattern in a nested form, i.e., the first pattern should have its protrusion arranged in the recess of the second pattern. Accordingly, the protrusive first pattern, which has protrusions protrusively provided isolated from one another and thus has a relatively low (fragile) mechanical strength (slab strength), is kind of reinforced by the second pattern, which has a large-area circumferential wall having recesses formed therein and thus has a relatively high mechanical strength, thereby enhancing the general structural strength of the thin film capacitor. Further, the arrangement reduces the influence of a change in mechanical strength originated from pattern changes in the first pattern and the second pattern caused by spreading of the side etching.

Further, it is further preferable that a planar shape (outer shape) of the protrusion of the first pattern should be similar to a planar shape (inner shape) of the recess of the second pattern. This further ensures that an increase or decrease in the circumferential length of the protrusion of the first pattern is canceled out with a decrease or increase in the circumferential length of the recess of the second pattern, thus more effectively suppressing a change in the total circumferential length of the first pattern and the second pattern (the entire inner circumferential length of the trench).

Furthermore, it is preferable that a planar shape of the protrusion of the first pattern and/or the recess of the second pattern should extend in a lengthwise direction, e.g., a terminated belt shape or an endless belt shape, a rectangular shape, an arcuate shape, a "<" shape, an S shape or a combination of those shapes, more specifically, a substantially oblong (rectangular) shape. Such an extending shape reduces the ratio of a size change caused by spreading or the side etching to the entire circumferential length.

The lengthwisely extending planar shapes of the protrusion of the first pattern and the recess of the second pattern are not restrictive, and it is more preferable that the protrusion of the first pattern or the recess of the second pattern should fulfill a relationship given by a following equation 1:

$$L/S \geq 2 \qquad (1)$$

where L is a length in a long axial direction (lateral length; the length of a long side in case of a rectangle, for example) and S is a length in a short axial direction (longitudinal length: the length of a short side in case of a rectangle, for example). That is, L/S is equivalent to an aspect ratio or a line/space ratio.

If the value of L/S is equal to or greater than 1 and less than 2, a rate of change in the ratio of a size change caused by spreading of the side etching to the entire circumferential length tends to becomes unfavorably large.

More specifically, it is particularly preferable that a planar shape of the first pattern and/or the second pattern should be a cross shape (type). This makes it easier to significantly increase the mechanical strength of the protrusion of the first pattern as compared with a case of an (oblong) quadrate shape, and is desirable particularly in a case where the planar size of the protrusion is reduced (though the mechanical strength becomes lower) to increase the pattern density in order to further increase the capacitance of the thin film capacitor by increasing the electrode surface area. The cross shape has an advantage that it is easier to increase the value of L/S three times or more.

Moreover, it is useful that the protrusion of the first pattern and/or the recess of the second pattern is arranged in a zigzagged grid pattern (alternately (including a checkered pattern)). In this case, the side wall of the trench defined by the protrusion of the first pattern and the recess of the second pattern is set in a bent shape excellent in mechanical strength (slab strength), i.e., "beams" extending in a row direction are reinforced by "beams" extending in a column direction at short intervals on the circumferential wall of the recess of the second pattern that defines each zone of the trench, so that the mechanical strength of the thin film capacitor is further increased. This is particularly effective in a case where the planar size of the protrusion is reduced (though the mechanical strength becomes lower) to increase the pattern density in order to further increase the capacitance of the thin film capacitor by increasing the electrode surface area.

Because the thin film capacitor of the present invention has a trench structure which is defined by the first pattern including protrusions and the second pattern separate from the first pattern and including recesses, side-etching originated changes in the circumferential lengths of the protrusion of the first pattern and the recess of the second pattern are canceled out with each other. This can significantly suppress a change in the circumferential length of the trench, thus making it possible to improve the uniformity of the capacitance while keeping a high capacitance.

DETAILED DESCRIPTION OF THE PREFERRED EMBODIMENTS

Figure 1:
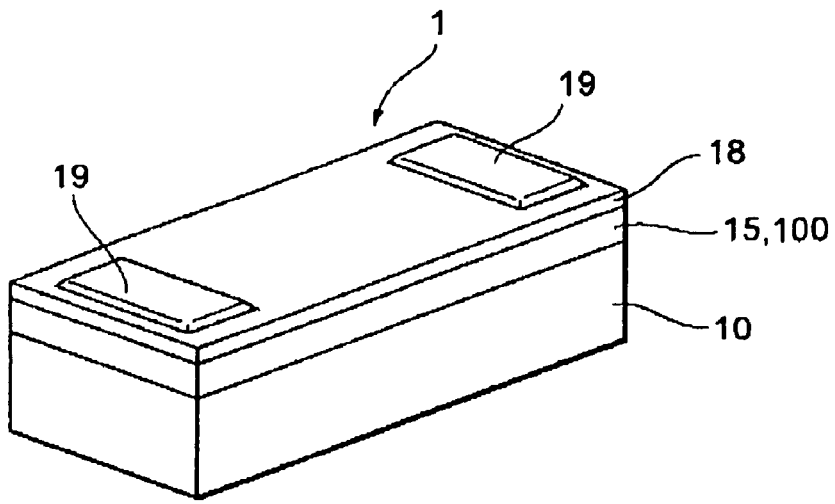
FIG. 1 is a perspective view showing the schematic configuration of a preferred embodiment of a thin film capacitor according to the present invention.

Preferred embodiments of the present invention will be described below with reference to the accompanying drawings. To avoid the redundant description, like or same reference numerals are given to like or same components. The positional relationships, such as up, down, left, and right, are based on the positional relationships shown in the diagrams unless otherwise specified. Further, the dimensional ratios in the diagrams are not limited to those shown therein. The following embodiments are to be considered as illustrative for explaining the present invention and not restrictive, and the invention is not to be limited only to the embodiments.

Before going into explanation of a trench pattern which characterizes a thin film capacitor of the present invention, configurational examples of a trench type thin film capacitor will be described for easier understanding according to the invention. The thin film capacitor of the invention is adaptable to any of the following configurational examples.

Configuration Example 1 of Thin Film Capacitor

Figure 2:
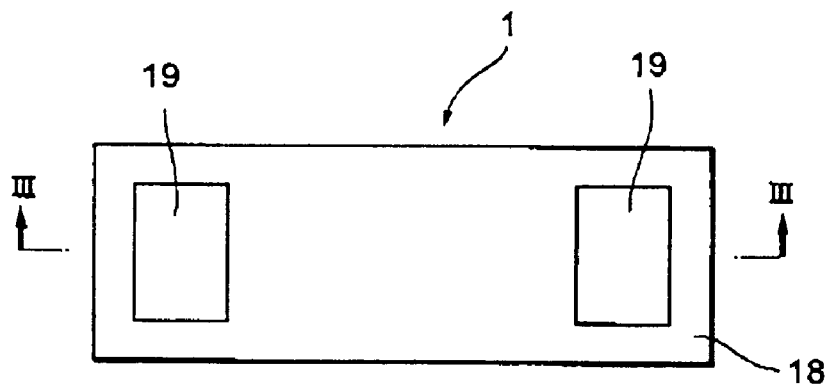
FIG. 2 is a plan view showing the schematic configuration of the preferred embodiment of the thin film capacitor according to the present invention.
Figure 3:
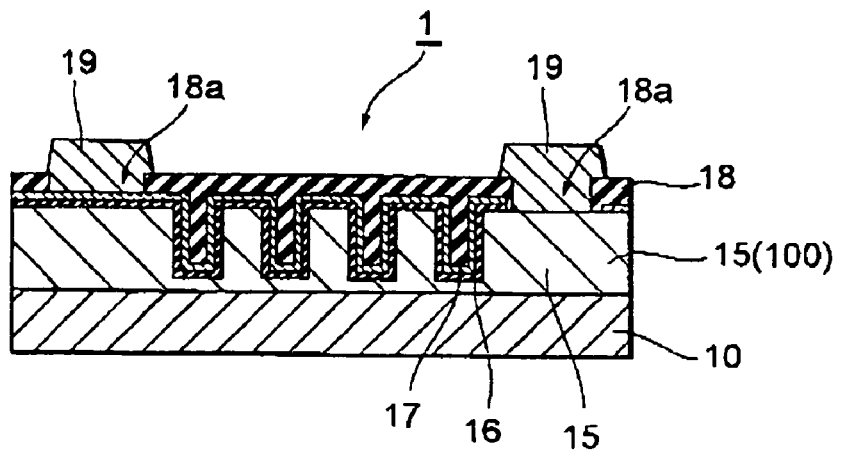
FIG. 3 is a cross-sectional view along line III-III in FIG. 2.

FIGS. 1 and 2 are a perspective view and a plan view showing the schematic configuration of a preferred embodiment of a thin film capacitor according to the present invention, and FIG. 3 is a cross-sectional view along line III-III in FIG. 2.

A thin film capacitor 1 in this configurational example has a trench pattern adequately fabricated by the additive method, and has a lower electrode 15 serving as a trench forming layer 100 where a trench pattern is to be formed, a dielectric film 16 so provided as to cover the lower electrode 15, and an upper electrode 17 laminated in order on the entire top surface of a substrate 10 (base substance). As a layer overlying the upper electrode 17, an insulative protection film 18 (passivation film) having two openings 18a is formed therein through which the upper electrode 17 and the lower electrode 15 are respectively exposed. Further, the two openings 18a of the protection film 18 are respectively connected to pad electrodes 19.

While the diagrams illustrate one unit of the thin film capacitor 1, a plurality of such thin film capacitors 1 may be formed on the substrate 10 (the same is true of the following examples).

Configurational Example 2 of Thin Film Capacitor

Figure 4:
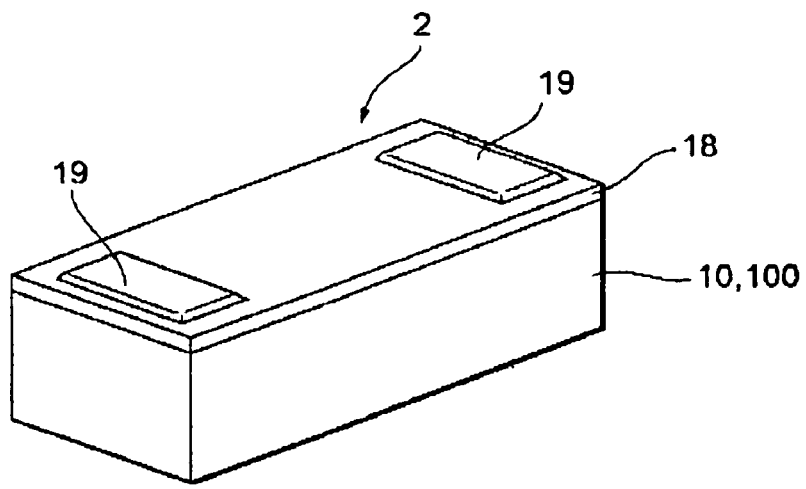
FIG. 4 is a perspective view showing the schematic configuration of another preferred embodiment of the thin film capacitor according to the present invention.
Figure 5:
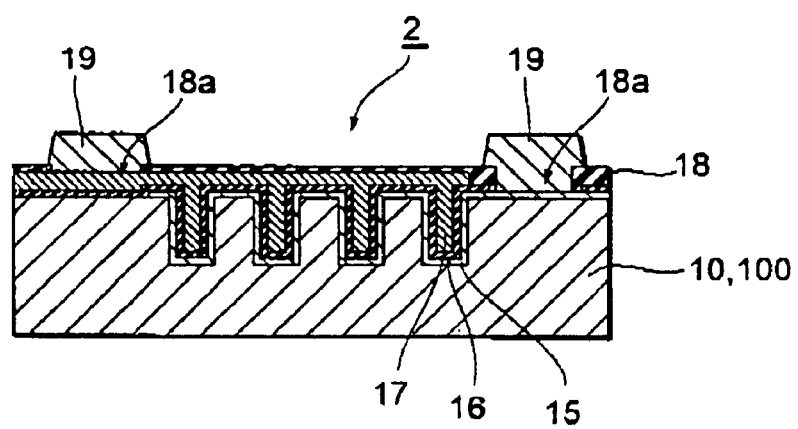
FIG. 5 is a cross-sectional view showing the schematic configuration of the another preferred embodiment of the thin film capacitor according to the present invention.

FIGS. 4 and 5 are a perspective view and a cross-sectional view showing the schematic configuration of another preferred embodiment of the thin film capacitor according to the present invention.

A thin film capacitor 2 in this configurational example has a trench pattern adequately fabricated by the subtractive method, and has a lower electrode 15 provided to cover the entire top surface of a substrate 10, which serves as a trench forming layer 100 where a trench pattern is to be formed, a dielectric film 16, and an upper electrode 17 laminated in order on the entire surface of the substrate 10. As a layer overlying the upper electrode 17, an insulative protection film 18 having two openings 18a is formed therein through which the upper electrode 17 and the lower electrode 15 are respectively exposed. Further, the two openings 18a of the protection film 18 are respectively connected to pad electrodes 19. In this configurational example, the substrate 10 may be a conductive substrate or an insulative substrate, but when the substrate 10 is a conductive substrate, an insulating film like a silicon oxide film is formed on the substrate 10 in order to secure the insulation property between the substrate and the lower electrode 15.

Configurational Example 3 of Thin Film Capacitor

Figure 6:
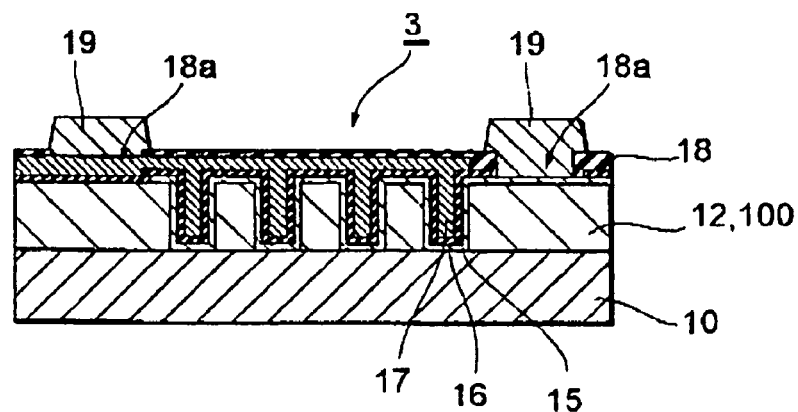
FIG. 6 is a cross-sectional view showing the schematic configuration of a further preferred embodiment of the thin film capacitor according to the present invention.

FIG. 6 is a cross-sectional view showing the schematic configuration of a further preferred embodiment of the thin film capacitor according to the present invention.

A thin film capacitor 3 in this configurational example has a trench pattern adequately fabricated by the subtractive method, and has an insulating layer 12 serving as a trench forming layer 100 where a trench pattern is to be formed, a lower electrode 15 so provided as to cover the insulating layer 12, a dielectric film 16, and an upper electrode 17 laminated in order on the entire top surface of a substrate 10. As a layer overlying the upper electrode 17, an insulative protection film 18 having two openings 18a is formed therein through which the upper electrode 17 and the lower electrode 15 are respectively exposed. Further, the two openings 18a of the protection film 18 are respectively connected to pad electrodes 19.

The capacitances of the thin film capacitors 1, 2, 3 are all expressed by a following equation 2:

$$C = \in \times S/d \qquad (2)$$

where C indicates the capacitance, $\in$ indicates a dielectric constant, S indicates an electrode surface area, and d indicates the thickness of the dielectric film 16. The dielectric constant $\in$ is given by a following equation 3:

$$\in = \in_r \in_0 \qquad (3)$$

where $\in_r$ indicates a specific dielectric constant and $\in_0$ indicates a specific dielectric constant in vacuum.

To increase a capacitance per unit volume of the thin film capacitor 1, 2, 3, therefore, with the dielectric constant $\in$ of the dielectric film 16 being constant, it is necessary to increase the electrode surface area S of the thin film capacitor 1 and/or reduce the thickness d of the dielectric film 16. To suppress a change in capacitance in the surface of the substrate 10 of a single or plural thin film capacitors 1 formed at the single substrate 10, it is important to make the electrode surface area of each thin film capacitor 1 uniform and make the thickness d of the dielectric film 16 uniform. To secure the uniformity of the electrode surface area in the surface of the substrate 10, in particular, it is very important to make the area of each trench (the entire inner circumferential length of the trench×the depth thereof+the bottom area thereof) uniform.

(Trench Pattern)

Next, a description will be given of a trench pattern to be formed on the trench forming layer 100 which constitutes the lower electrode 15, the substrate 10 or the insulating layer 12 in each of the foregoing configurational examples.

Figure 7:
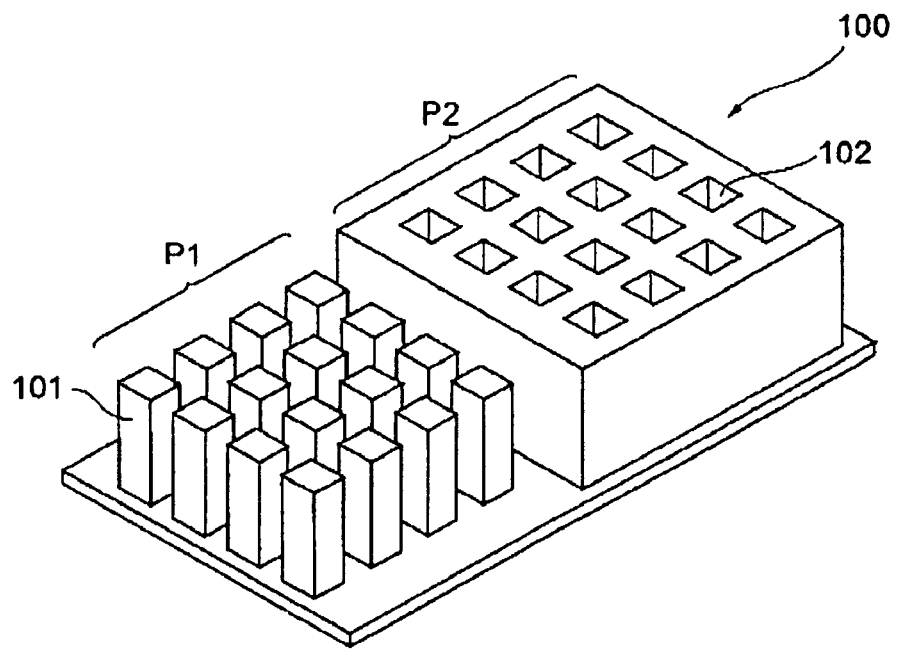
FIG. 7 is a perspective view exemplarily showing one example of a trench pattern provided at the thin film capacitor of the present invention.

FIG. 7 is a perspective view exemplarily showing one example of a trench pattern provided at the thin film capacitor of the present invention.

This trench pattern has a first pattern P1 and a second pattern P2 which is juxtaposed to the first pattern and separate from the first pattern. The first pattern P1 and the second pattern P2 are provided, isolated from each other, at separate regions this way. The first pattern P1 has a plurality of (4×4 in the diagram) protrusions (convex portions) 101 with the same outer shape provided upright at predetermined intervals in a matrix pattern (grid pattern). The second pattern P2 has a plurality of (4×4 in the diagram) recesses 102 with the same inner shape, which are equal in number to the protrusions 101 and provided at predetermined intervals in a matrix pattern (grid pattern). The individual recesses 102 are defined by circumferential walls formed in a grid pattern. Further, the height of each protrusion 101 of the first pattern P1 is set approximately equal to the depth of each recess 102 of the second pattern P2. The planar shape of the protrusion 101 (quadrate in the diagram) and the planar shape of the recess 102 (quadrate in the diagram) are congruent or similar to each other.

In this manner, trenches are defined by the outer walls of the protrusions 101 in the first pattern P1, and trenches are defined by the inner walls of the recesses 102 in the second pattern P2. The widths of the individual trenches are set substantially constant.

Figure 8:
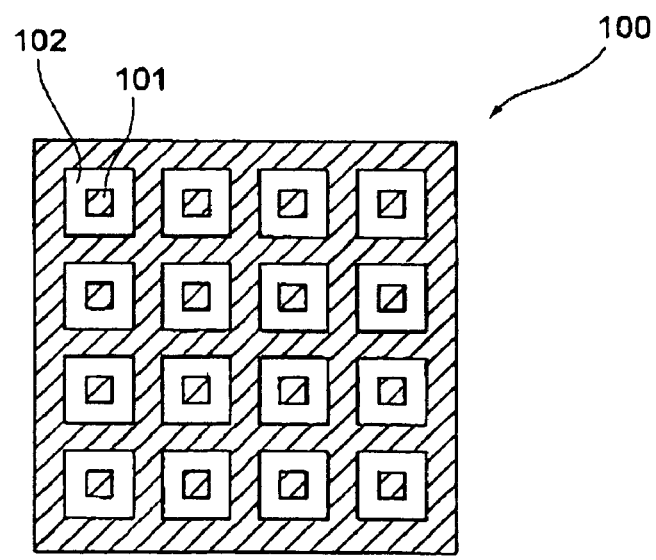
FIG. 8 is a plan view exemplarily showing another example of the trench pattern provided at the thin film capacitor of the present invention.
Figure 9:
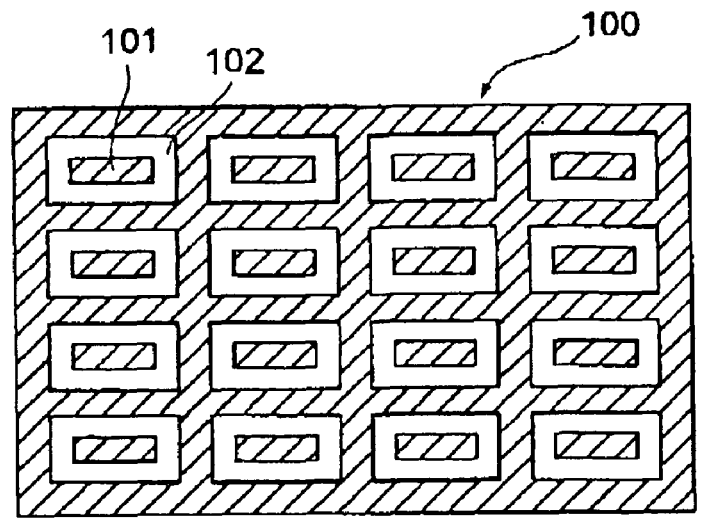
FIG. 9 is a plan view exemplarily showing a different example of the trench pattern provided at the thin film capacitor of the present invention.

FIGS. 8 and 9 are plans view exemplarily showing different examples of the trench pattern. FIG. 8 shows an example where the protrusions 101 and recesses 102 are quadrate, and FIG. 9 shows an example where the protrusions 101 and recesses 102 are rectangular. In those trench patterns, the protrusions 101 of the first pattern P1 are arranged in the internal spaces of the recesses 102 of the second pattern P2 in a nested form and in a concentric form in such a way that the protrusions 101 are retained in the internal spaces of the recesses 102, and trenches are defined by the outer walls of the protrusions 101 of the first pattern P1 and the inner walls of the recesses 102 of the second pattern P2. In either trench pattern, the planar shape of the protrusion 101 is approximately similar to the planar shape of the recess 102, and the widths of the trenches are substantially constant.

The advantages of the trench pattern according to the embodiment will be described below with the pattern shown in FIG. 9 taken as an example.

Figure 10:
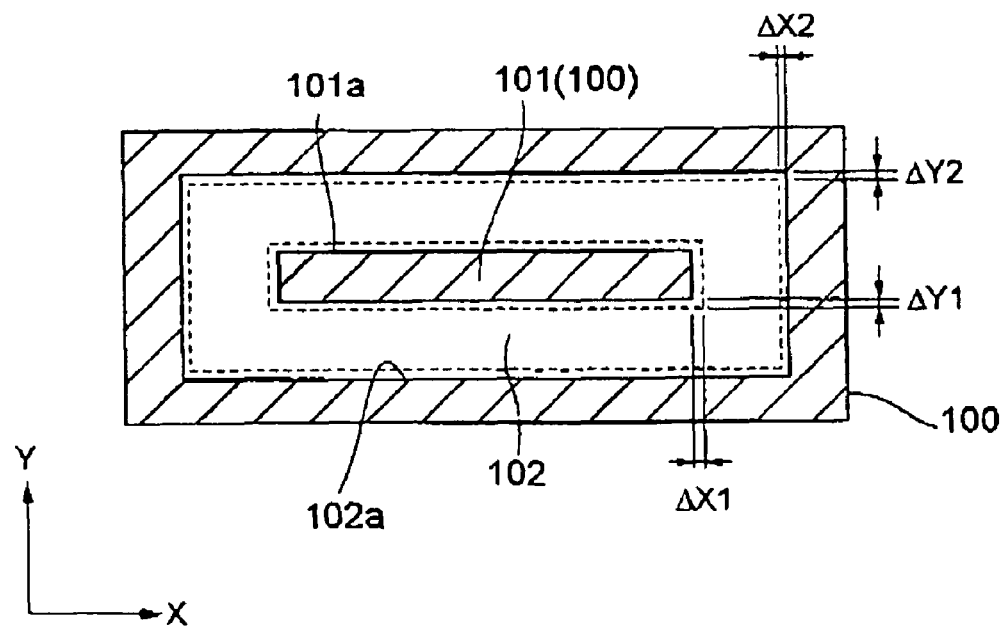
FIG. 10 is a plan view exemplarily showing one trench unit in the trench pattern shown in FIG. 9.
Figure 11:
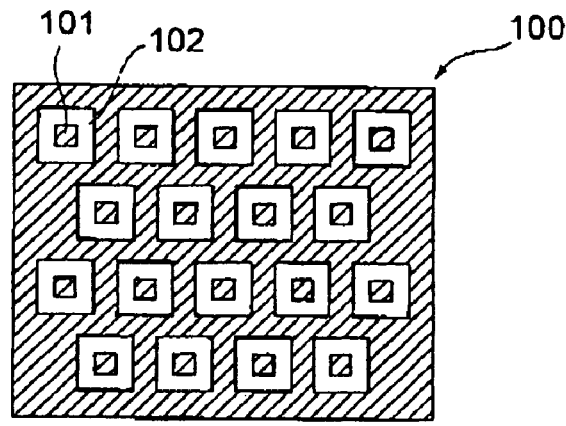
FIG. 11 is a plan view exemplarily showing a further example of the trench pattern.
Figure 12:
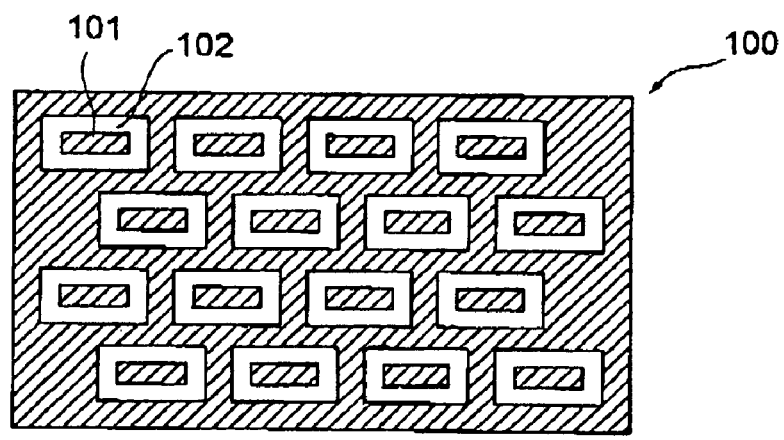
FIG. 12 is a plan view exemplarily showing a still further example of the trench pattern.
Figure 13:
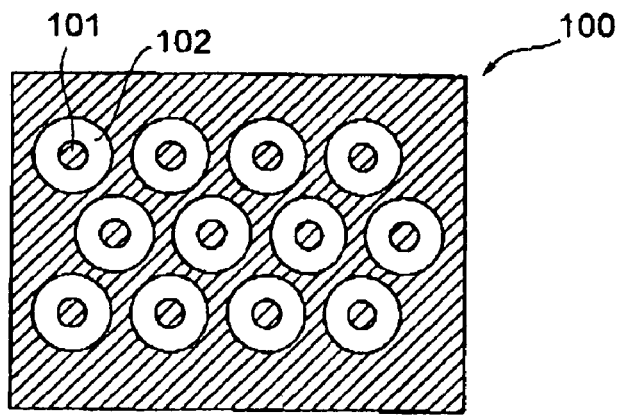
FIG. 13 is a plan view exemplarily showing a yet still further example of the trench pattern.

FIG. 10 is a plan view exemplarily showing one trench unit in the trench pattern shown in FIG. 9. The first pattern P1 (protrusions 101 thereof) and the second pattern P2 (recesses 102 thereof) can both be formed by a method of etching the trench forming layer 100 using a resist pattern (subtractive method) or a method of additionally forming the trench forming layer 100 using a resist pattern (additive method). An insulating layer or a metal layer of a material other than an organic photosensitive material may be used as a resist.

In the case of the subtractive method of etching the substrate 10 serving as the trench forming layer 100, for example, side etching of an outer wall 101a of the protrusion 101 progresses inward from outward in the first pattern P1, so that as etching progresses (side etching spreads), the outer shape of the protrusion 101 becomes smaller, shortening the outer peripheral length (circumferential length) of the first pattern P1, in such a way that the spatial shape of the trench defined by the outer wall 101a of the protrusion 101 increases. Meanwhile, side etching of an inner wall 102a of the recess 102 progresses outward from inward in the second pattern P2, so that as etching progresses, the inner shape of the recess 102 becomes larger, increasing the inner peripheral length (circumferential length) of the second pattern P2, in such a way that the spatial shape of the trench defined by the inner wall 102a of the recess 102 increases.

More specifically, the targeted shapes of the protrusion 101 and the recess 102 lie within ranges indicated by broken lines in FIG. 10 (hereinafter referred to as "target shapes"), and when the etching condition changes to increase the amount (rate) of side etching, the protrusion 101 of the first pattern P1 becomes a shape reduced from the target shape by $\Delta x1$ in the x direction in the diagram and $\Delta y1$ in the y direction in the diagram. The reduced amount $\Delta$ of the circumferential length of the protrusion 101 then becomes $4\times(\Delta x1+\Delta y1)$. Meanwhile, the recess 102 of the second pattern P2 becomes a shape enlarged from the target shape by $\Delta x2$ in the x direction in the diagram and $\Delta y2$ in the y direction in the diagram. The increased amount $\Delta$ of the circumferential length of the recess 102 then is substantially equal to the reduced amount $\Delta$ of the circumferential length of the protrusion 101 and becomes $4\times(\Delta x2+\Delta y2)$. That is, because the amounts of side etching are normally substantially the same at proximal positions, it is likely that $\Delta x1=\Delta x2$ and $\Delta y1=\Delta y2$. In the case of anisotropic etching which hardly yields an anisotropic component, particularly, it is likely that $\Delta x1=\Delta y1=\Delta x2=\Delta y2$.

Even when the etching condition changes to increase the amount (rate) of side etching, the reduced amount of the circumferential length of the protrusion 101 and the increased amount of the circumferential length of the recess 102 become equal to each other and are canceled out with each other, and the action takes place over the entire first pattern P1 and second pattern P2 formed on the substrate 10, a change in the entire inner circumferential length of the trench defined in the thin film capacitor 1 (the total length of the circumferential length of all the protrusions 101 of the first pattern P1 and the circumferential length of all the recesses 102 of the second pattern P2) is prevented. Even when the etching condition changes to decrease the amount (rate) of side etching, contrary to the above, the circumferential length of the protrusion 101 increases and the circumferential length of the recess 102 decreases, at which time the increased amount of the circumferential length of the protrusion 101 and the reduced amount of the circumferential length of the recess 102 become equal to each other and are canceled out with each other. In this case, a change in the circumferential length of the trench defined in the thin film capacitor 1 is prevented.

In the case of using the additive method of additionally forming the trench forming layer 100 on the substrate 10, when the size of the opening in the resist pattern becomes wider, the outer shape of the protrusion 101 of the first pattern P1 becomes larger, while the inner shape of the recess 102 of the second pattern P2 becomes smaller. When the size of the opening in the resist pattern becomes narrower, on the contrary, the outer shape of the protrusion 101 of the first pattern P1 becomes smaller, while the inner shape of the recess 102 of the second pattern P2 becomes larger. Because of the same reason as applied to the subtractive method, therefore, an increase/decrease in the circumferential length of the protrusion 101 of the first pattern P1 which defines a trench is canceled out with a decrease/increase in the circumferential length of the recess 102 of the second pattern P2. As a result, a change in the entire inner circumferential length of the trench (the total length of the circumferential length of all the protrusions 101 of the first pattern P1 and the circumferential length of all the recesses 102 of the second pattern P2) is prevented.

Therefore, the thin film capacitor 1 having a trench pattern which suppresses a change in the entire inner peripheral length can prevent changes in the surface areas of the lower electrode 15 and the upper electrode 17, so that the uniformity of the capacitance in the surface of the substrate can be improved while keeping a high capacitance with the trench structure. As the number of the protrusions 101 of the first pattern P1 is set equal to the number of the recesses 102 of the second pattern P2, an increase/decrease in the circumferential length of a plurality of protrusions 101 of the first pattern P1 can surely be canceled out with a decrease/increase in the circumferential length of a plurality of recesses 102. This can further suppress a change in the entire inner peripheral length of the trench to further improve the uniformity of the capacitance in the surface of the substrate. In addition, a change in the electrode surface area determined by the product of the entire inner peripheral length of the trench and the depth thereof is sufficiently suppressed, thereby making it possible to further improve the uniformity of the capacitance in the surface of the substrate.

To further increase the capacitance per unit volume of the thin film capacitor 1, it is desirable to increase the density of the protrusion 101 of the first pattern P1 and the recess 102 of the second pattern P2 to thereby increase the entire inner peripheral length of the trench defined by them. In this case, while it is effective to make the shapes of the protrusion 101 and the recess 102 finer, the mechanical strength of the individual protrusions 101 provided upright may drop to an unfavorable level.

As the protrusion 101 of the first pattern P1 is arranged in the recess 102 of the second pattern P2 in a nested form as mentioned above, however, the protrusive first pattern P1 whose mechanical strength (slab strength) is relatively low (fragile) is reinforced by the second pattern P2 which has a large-area circumferential wall having recesses 102 formed therein to have a relatively high mechanical strength. It is therefore possible to enhance the general structural strength of the thin film capacitor 1 while increasing the density of the protrusions 101 and the recesses 102 to further increase the capacitance. Further, the arrangement can reduce the influence of a change in mechanical strength originated from pattern changes in the first pattern and the second pattern caused by spreading of the side etching.

Further, the planar shape (outer shape) of the protrusion 101 of the first pattern P1 is similar to the planar shape (inner shape) of the recess 102 of the second pattern P2, so that an increase/decrease in the circumferential length of the protrusion 101 is canceled out with a decrease/increase in the circumferential length of the recess 102. This more effectively suppresses a change in the total inner peripheral length of the trench, so that the uniformity of the capacitance of the thin film capacitor 1 in the surface of the substrate can be made more stable and improved more.

In a case where the planar shapes of the protrusion 101 and the recess 102 are shapes having different longitudinal and lateral lengths and extending in the lengthwise direction as typified by a rectangle as shown in FIG. 10, the ratio of a change $\Delta$ to the entire inner peripheral length of the trench can be made smaller as compared with a case where the planar shapes are squares. In other words, assuming that one side of a square and the length of the short side of a rectangle are minimum values determined by the line/space pattern, the circumferential length becomes longer in the case of the rectangle. If the circumferential length of one unit of the protrusion 101 and the recess 102 becomes longer, a ratio of a change $\Delta$ to the circumferential length can be made smaller, resulting in a smaller ratio of a change $\Delta$ to the entire inner peripheral length of the trench. This makes it possible to further improve the uniformity of the capacitance of the thin film capacitor 1 in the surface of the substrate.

Figure 40:
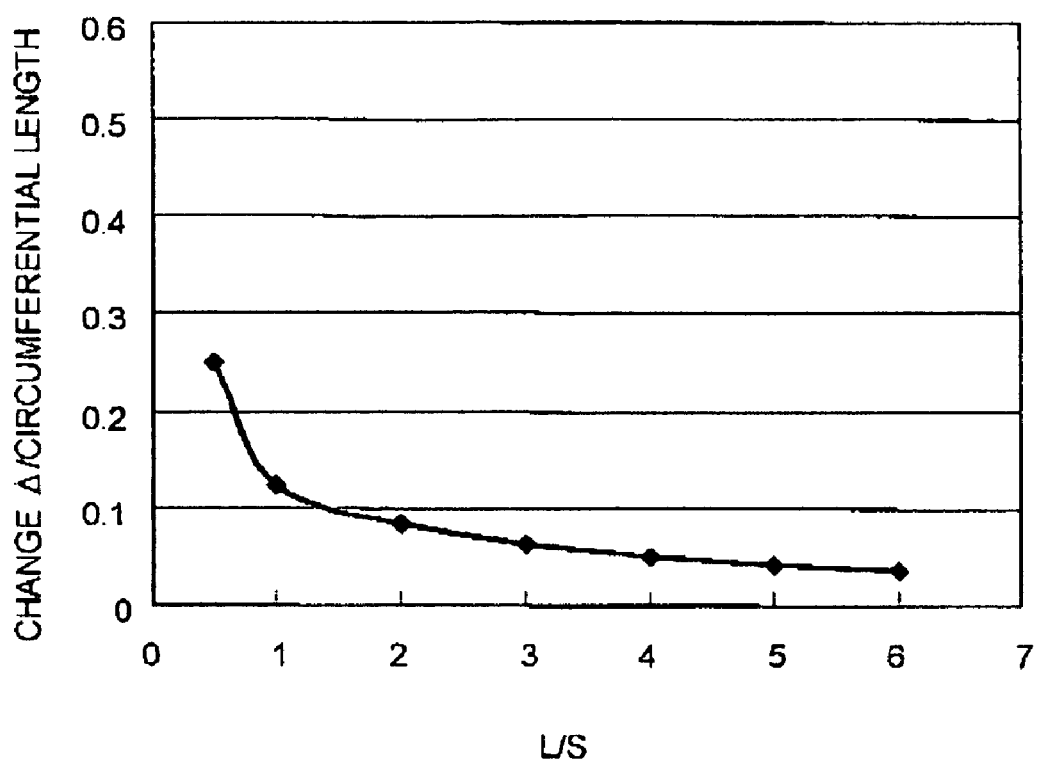
FIG. 40 is a graph showing a relationship between L/S in a trench pattern and the ratio of a change $\Delta$ to the circumferential length of one trench unit.

FIG. 40 is a graph showing a relationship of the ratio of a change Δ to the circumferential length of one trench unit (change rate) with respect to the ratio (L/S) of the length L of the long side of the protrusion 101 or the recess 102 in a trench pattern having the protrusions 101 and recesses 102 which have rectangular planar shapes shown in FIG. 10 to the length S of the short side thereof (the ratio L/S being standardized to be 1.0 as the minimum value determined by the line/space pattern as mentioned above). In the diagram, the abscissa represents the L/S value and the ordinate represents the change Δ (set to 0.5 with respect to the short side length of 1.0)/circumferential length.

Accordingly, it is understood that with the short side lengths S being the same, increasing the long side L increases the circumferential length of one trench unit constituted by the protrusion 101 and the recess 102, so that the ratio of the change Δ to the circumferential length becomes smaller. In the result shown in FIG. 40, while it is assumed that the short side length of the trench takes a minimum value determined by the line/space pattern, the change Δ equivalent to a change in line width is assumed to be significantly smaller than a half (0.5) of the short side length S for the precision of the recent photolithography is extremely high. If a change ratio of 10% or less can be achieved in the graph shown in FIG. 40 with the change Δ being 0.5, it is possible to sufficiently suppress a variation in the change in the entire inner peripheral length of the trench. Therefore, L/S is preferably set to 2 or greater, more preferably to 3 or greater to achieve a lower rate of change.

FIGS. 11 to 15 are plan views exemplarily showing further examples of the trench pattern. In those trench patterns, the protrusions 101 of the first pattern P1 are arranged in the internal spaces of the recesses 102 of the second pattern P2 in a nested form and in a concentric form, or the protrusions 101 in the first pattern P1 and the recesses 102 in the second pattern P2 are arranged to be shifted every adjoining stage, i.e., arranged in a zigzagged grid pattern. FIGS. 11 to 15 show examples where the planar shapes of the protrusion 101 and the recess 102 are a quadrate, rectangle, circle, hexagon and cross shape, respectively.

With this configuration, "beams" extending in the row direction are reinforced by "beams" extending in the column direction at shorter intervals on the circumferential wall of the recess 102 of the second pattern P2 that defines each zone of the trench, as compared with the trench pattern as shown in FIG. 8, for example, i.e., the side wall of the trench defined by the protrusion 101 of the first pattern P1 and the recess 102 of the second pattern P2 is set in a bent shape excellent in mechanical strength (slab strength). Therefore, the mechanical strength of the thin film capacitor 1 is further increased, so that the trench pattern is more effective in a case where the density of the protrusions 101 and the recesses 102 are increased to increase the electrode surface area, thereby making the capacitance of the thin film capacitor 1 higher.

Figure 14:
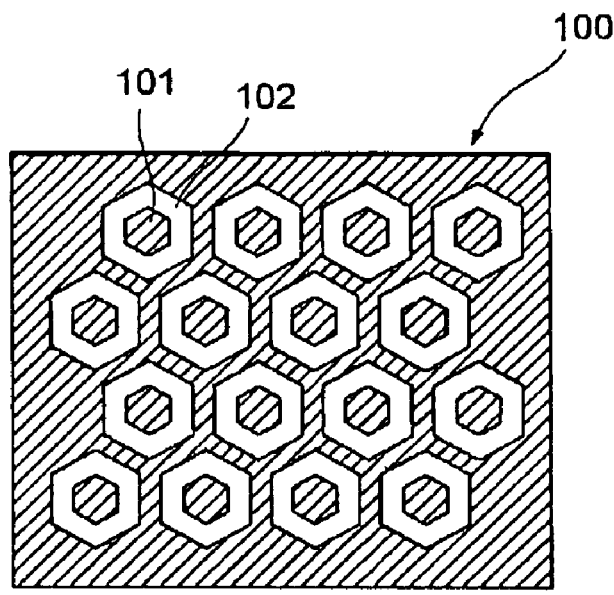
FIG. 14 is a plan view exemplarily showing a yet still further example of the trench pattern.
Figure 15:
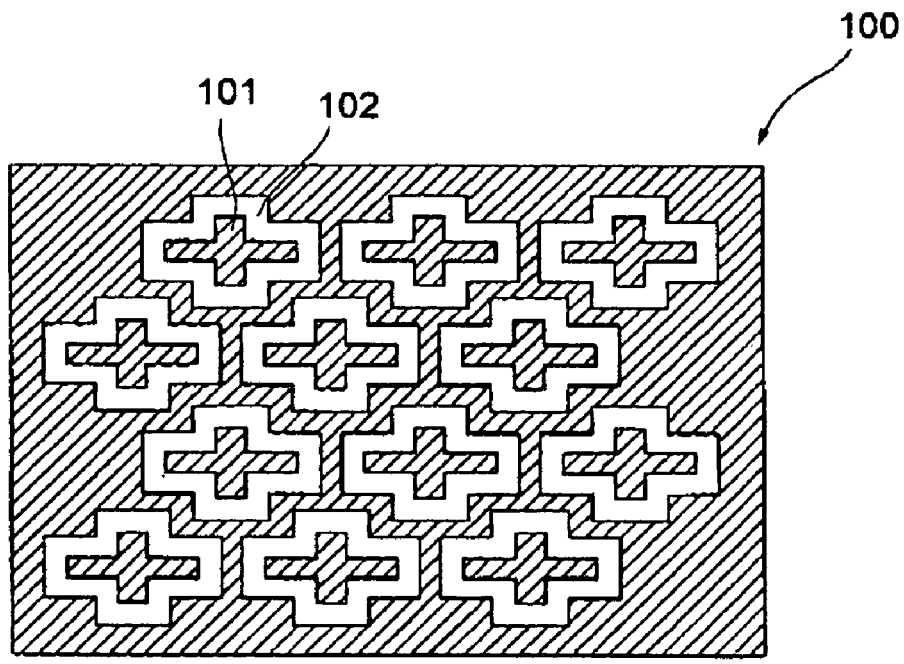
FIG. 15 is a plan view exemplarily showing a yet still further example of the trench pattern.

If the planar shapes of the protrusions 101 and the recesses 102 take figure shapes having five or more bent portions like a hexagonal honeycomb structure as shown in FIG. 14, the mechanical strength of the protrusion 101 itself can be enhanced more, thereby improving the structural strength of the first pattern P1 which tends to have a relatively lower structural strength than the second pattern P2. Further, as shown in FIG. 15, the cross shape can further enhance the mechanical strength of the protrusion 101 itself and eventually the structural strength of the first pattern P1. Therefore, those trench patterns are particularly effective in a case where the density of the protrusions 101 and the recesses 102 are increased to increase the electrode surface area, thereby making the capacitance of the thin film capacitor 1 higher. The cross shape has an advantage that it is easier to increase the value of L/S (aspect ratio) three times or more.

Figure 16:
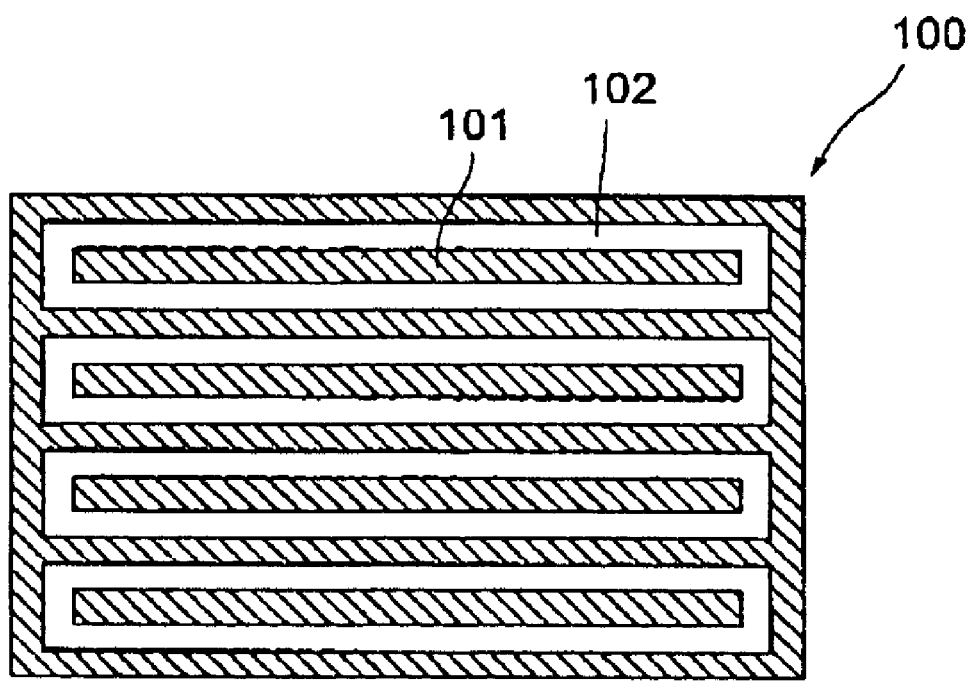
FIG. 16 is a plan view exemplarily showing a yet still further example of the trench pattern.

FIG. 16 is a plan view exemplarily showing a yet still further example of the trench pattern. In the trench pattern, the long side of the recess 102 of the second pattern P2 is increased to a maximum in the row direction, the recesses 102 are repeatedly arranged only in the column direction and the protrusions 101 of the first pattern P1 are disposed in the respective recesses 102. This configuration can make the circumferential lengths of the protrusions 101 of the first pattern P1 and the recesses 102 of the second pattern P2 longer while increasing the pattern density, so that the ratio of the change Δ to the entire circumferential length of the trench can be made smaller, thereby particularly improving the uniformity of the capacitance of the thin film capacitor 1 in the surface of the substrate.

Fabrication Example 1 of Thin Film Capacitor

One example of the fabrication method for the thus configured thin film capacitor 1 will be described below. FIGS. 17 to 33 are cross-sectional views showing states of fabricating the thin film capacitor 1 (process flow diagrams).

Figure 17:
FIG. 17 is a cross-sectional view showing a state of fabricating a thin film capacitor 1.

First, as shown in FIG. 17, the substrate 10 provided with the thin film capacitor 1 is prepared. The substrate 10 is not particularly restrictive, and can be a silicon substrate, a ceramic substrate of alumina or the like, a glass ceramic substrate, a glass substrate, a single crystal substrate of sapphire, MgO, $SrTiO_3$ or the like, or a metal substrate of Fe—Ni alloy or the like, and is preferably a type which chemically and thermally stable, generates less stress and is easy to hold the surface smoothness. When a conductive substrate, such as a metal substrate or silicon substrate, is used as the substrate 10, it is preferable to form an insulating film like an oxide film on the top surface of the substrate 10 to secure the insulation property.

Figure 18:
FIG. 18 is a cross-sectional view showing a state of fabricating the thin film capacitor 1.

Next, as shown in FIG. 18, a base metal layer 11 is formed on the substrate 10. The material for the base metal layer 11 is not particularly restrictive as long as it is a metal layer; however, it is preferable to use the same material for a second metal layer 14 to be described later which constitutes a part of the lower electrode 15 for it is easy to prevent separation or lacking of the base metal layer 11 at the time of removing a first metal layer 13 to be described later. Examples of such metal materials include metals essentially containing Au, Pt, Ag, Sn, Cr, Co, Ni, Cu or the like, alloys of those metals, or composite metals containing the alloys. It is particularly preferable to use a metal essentially containing Ni among those examples. The use of a metal essentially containing Ni can make the stress on a film to be formed to nearly zero, and can thus effectively prevent deforming of the base metal layer 11 or the second metal layer 14 and the substrate 10. The base metal layer 11 of such a metal material can be formed by, for example, PVD like sputtering, or CVD.

Figure 19:
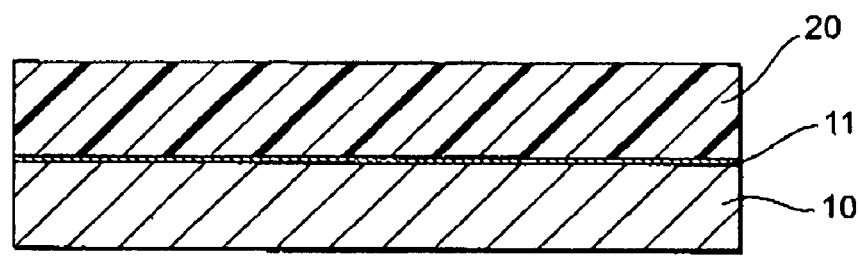
FIG. 19 is a cross-sectional view showing a state of fabricating the thin film capacitor 1.

Then, as shown in FIG. 19, a resist layer 20 is formed on the base metal layer 11. The resist layer 20 in use can be a negative resist or a positive resist. In case of the negative resist, it is preferable to use a chemically amplified resist for the resist can improve the patterning precision.

Figure 20:
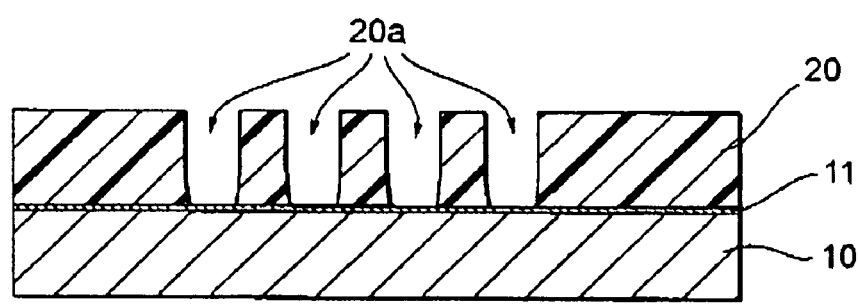
FIG. 20 is a cross-sectional view showing a state of fabricating the thin film capacitor 1.

Then, as shown in FIG. 20, exposure and development of the resist layer 20 are carried out using a mask pattern of trenches to form openings 20a at portions where trenches are to be formed, thereby exposing the base metal layer 11 at the bottoms of the openings 20a. When a positive resist is used, regions where the openings 20a are to be formed are exposed, and the resist in the exposed portions is dissolved in a developer. When a negative resist is used, regions other than the openings are exposed, and the resist in the unexposed portions is dissolved in the developer. The pattern of the resist layer 20 is the same as the first pattern P1 and the second pattern P2 to be formed. That is, portions equivalent to the protrusions 101 of the first pattern P1 are left and portions equivalent to the recesses 102 of the second pattern P2 are made into the openings 20a.

Figure 21:
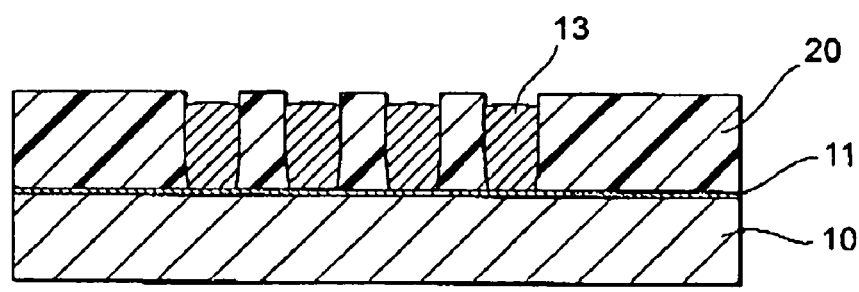
FIG. 21 is a cross-sectional view showing a state of fabricating the thin film capacitor 1.

Next, as shown in FIG. 21, the first metal layer 13 having an inverted pattern (transfer pattern) of trenches is formed in the openings 20a of the resist layer 20 by plating. The plating may be electroplating or electroless plating (chemical plating); for example, the first metal layer 13 is formed by electroplating using the base metal layer 11 as a base. Examples of materials for the first metal layer 13 include metals essentially containing Au, Pt, Ag, Sn, Cr, Co, Ni, Cu or the like, alloys of those metals, or composite metals containing the alloys, but different from the materials for the base metal layer 11 and the second metal layer 14 to be described later. When metals essentially containing Ni are used for the base metal layer 11 and the second metal layer 14 as mentioned above, for example, it is preferable to use a metal essentially containing Cu for the first metal layer 13.

Figure 22:
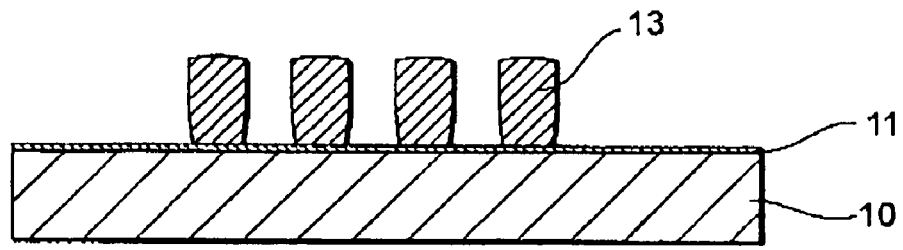
FIG. 22 is a cross-sectional view showing a state of fabricating the thin film capacitor 1.

Thereafter, as shown in FIG. 22, the resist layer 20 is removed. As a result, the first metal layer 13 having an inverted pattern of the protrusions 101 of the first pattern P1 and the recesses 102 of the second pattern P2 is formed. That is, the pattern of the first metal layers 13 is formed at portions equivalent to the recesses 102 of the second pattern P2, not at portions equivalent to the protrusions 101 of the first pattern P1.

Figure 23:
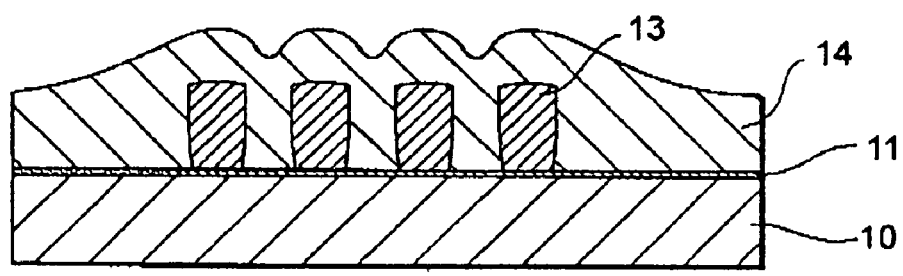
FIG. 23 is a cross-sectional view showing a state of fabricating the thin film capacitor 1.

Next, as shown in FIG. 23, the second metal layer 14 which buries between the first metal layers 13 is formed by plating. As in the case of the first metal layer 13, the plating may be electroplating or electroless plating (chemical plating); for example, the first metal layer 13 is formed by electroplating using the base metal layer 11 as a base. Accordingly, the first metal layers 13 are covered with the second metal layer 14. Examples of materials for the second metal layer 14 include metals essentially containing Au, Pt, Ag, Sn, Cr, Co, Ni, Cu or the like, alloys of those metals, or composite metals containing the alloys, but different from the material for the first metal layer 13. When a metal essentially containing Cu is used for the first metal layer 13 as mentioned above, for example, it is preferable to use a metal essentially containing Ni for the second metal layer 14.

Figure 24:
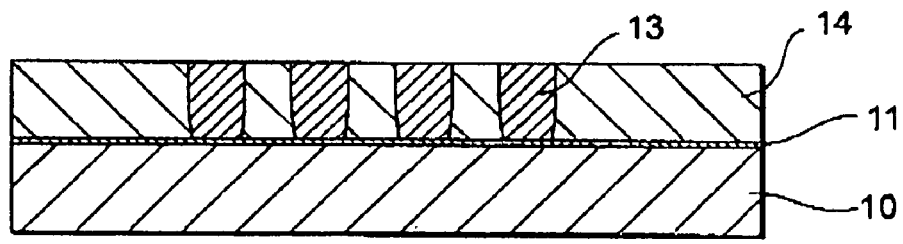
FIG. 24 is a cross-sectional view showing a state of fabricating the thin film capacitor 1.

Then, as shown in FIG. 24, the top surface of a composite comprising the first metal layers 13 and the second metal layer 14 is polished from above to be planarized by CMP (Circular Movement Polishing or Chemical Mechanical Polishing) to make the heights of the first metal layers 13 and the second metal layer 14 flush with one another. At this time, first, the second metal layer 14 is polished to expose the first metal layers 13, after which both the first metal layers 13 and the second metal layer 14 are polished. Accordingly, the height of the first metal layers 13 becomes lower than the one at the time of deposition shown in FIG. 22.

Figure 25:
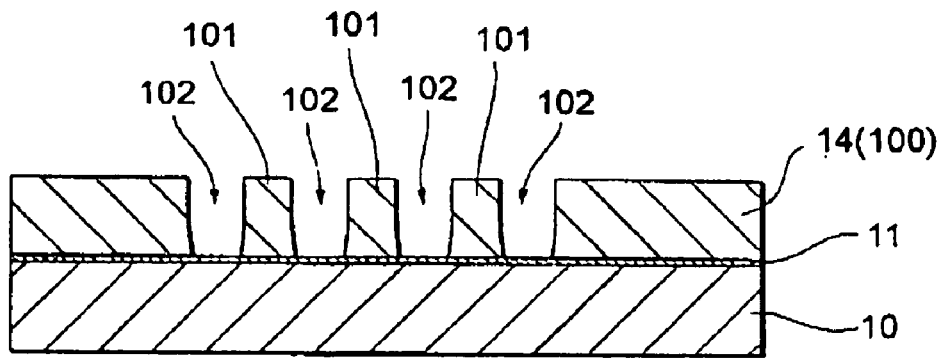
FIG. 25 is a cross-sectional view showing a state of fabricating the thin film capacitor 1.

Next, as shown in FIG. 25, the first metal layers 13 are removed to thereby form a trench pattern defined by the first pattern P1 having the protrusions 101 and the second pattern P2 having the recesses 102, thus locally exposing the base metal layer 11 at the bottom of the trench pattern. When the first metal layer 13 comprises a metal essentially containing Cu as mentioned above, it is preferable to immerse the substrate 10 shown in FIG. 24 in ammonia or the like (alkali) which selectively dissolves Cu as a method of removing the first metal layer 13, and inorganic cerium ammonium or the like, such as cerium ammonium nitrate or cerium ammonium sulfate, can be used though it slightly dissolves a metal essentially containing Ni which is the metal material for the base metal layer 11 and the second metal layer 14. Accordingly, the first metal layers 13 are selectively removed.

Figure 26:
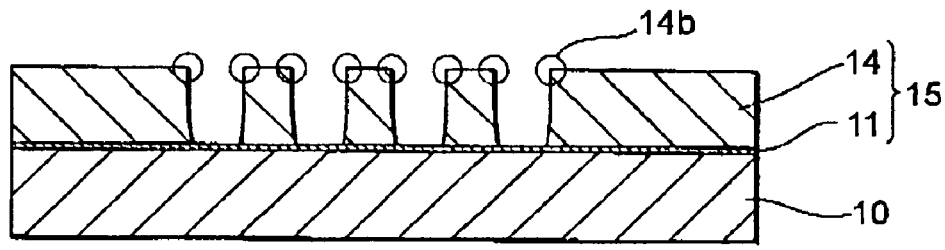
FIG. 26 is a cross-sectional view showing a state of fabricating the thin film capacitor 1.

Thereafter, as shown in FIG. 26, a rounding process is performed to chamfer the edges of opening edges 14b (portions indicated by circles in the diagram) of the second metal layer 14 to further improve the coverage of the dielectric film (i.e., remove the angled portions of the second metal layer 14) to form curved surfaces. The chamfering process is not particularly restrictive as long as it can partly remove the opening edges 14b of the second metal layer 14, and can be full-surface ion milling, or wet or dry etching.

Ion milling or etching selectively chamfers the opening edges 14b without removing the second metal layer 14 or the base metal layer 11 for the milling rate or etch rate for the angled portions of the opening edges 14b are likely to be significantly greater than the side milling rate and side etch rate for the outer walls of the protrusions 101 and the inner walls of the recesses 102 (i.e., the inner walls of the trenches) and the side milling rate and side etch rate for the bottom walls. Particularly, milling is preferable over etching because a difference in milling rates for the edge portions like the opening edges 14b and the flat portions like the inner walls and bottom walls of the trenches is greater than a difference in etch rates for the same target portions (i.e., selective removability is higher). As a result, the formation of the lower electrode 15 comprising the base metal layer 11 and the second metal layer 14 is completed.

Figure 27:
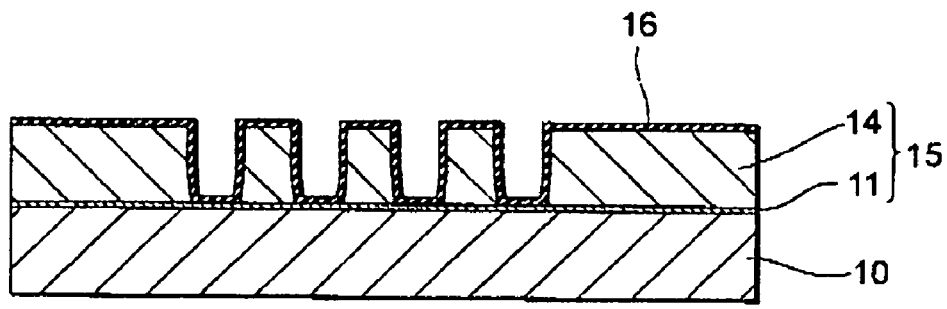
FIG. 27 is a cross-sectional view showing a state of fabricating the thin film capacitor 1.

Next, as shown in FIG. 27, the dielectric film 16 is formed on the entire top surface of the substrate 10 in the state shown in FIG. 26. Accordingly, the inner walls of the trenches and the second metal layer 14 are covered with the dielectric film 16. The material for the dielectric film 16 is not particularly restrictive, and a dielectric material, such as $Al_2O_3$, PZT or $BaTiO_3$, can be used. From the viewpoint of increasing the capacitance C, it is preferable to use a ferroelectric material, such as PZT or $BaTiO_3$, which has a large dielectric constant $\in_r$. In case of using such a ferroelectric material, a heat treatment is performed to excite the dielectric polarization as needed after deposition of the dielectric film 16. CVD, PVD or the like can be used in depositing the dielectric film 16. It is preferable to use CVD particularly from the viewpoints that CVD is excellent in step coverage and is easy to increase the capacitance C and make the capacitance C uniform by making the thickness d of the dielectric film 16 thinner and uniform.

Figure 28:
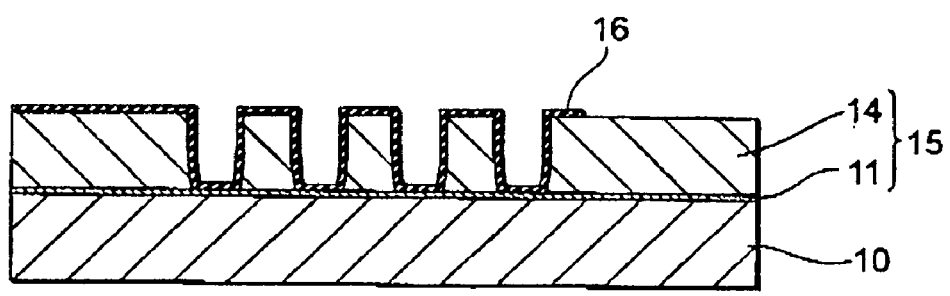
FIG. 28 is a cross-sectional view showing a state of fabricating the thin film capacitor 1.

Further, as shown in FIG. 28, a resist pattern having openings (through holes, via holes) at the regions where the lower electrode 15 is connected to the pad electrodes 19 is formed, and the dielectric film 16 in the openings is removed by RIE or so.

Figure 29:
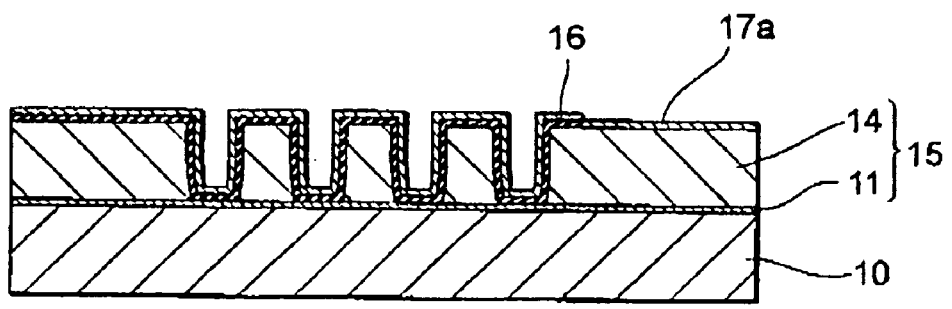
FIG. 29 is a cross-sectional view showing a state of fabricating the thin film capacitor 1.

Next, as shown in FIG. 29, an electrode film 17a for forming the upper electrode 17 is deposited on the entire top surface of the substrate 10 in the state shown in FIG. 28. The material for the upper electrode 17 is not particularly restrictive, and can be Cu, Ni, Al or the like, for example. The deposition of the electrode film 17a can be carried out using, for example, PVD like sputtering.

Figure 30:
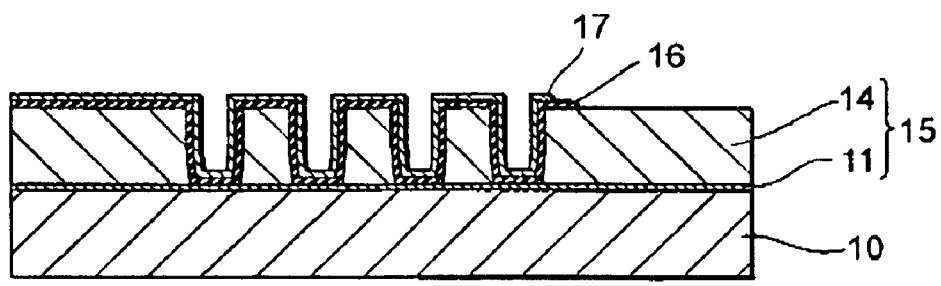
FIG. 30 is a cross-sectional view showing a state of fabricating the thin film capacitor 1.

Thereafter, as shown in FIG. 30, a resist pattern is formed on the electrode film 17a by a photolithography process, and patterning is performed to locally etch the electrode film 17a using the resist pattern, thereby forming the upper electrode 17. At this time, the upper electrode 17 is patterned to be inward of the planar outer periphery of the dielectric film 16 so that the upper electrode 17 does not contact the lower electrode 15 at its edges.

Figure 31:
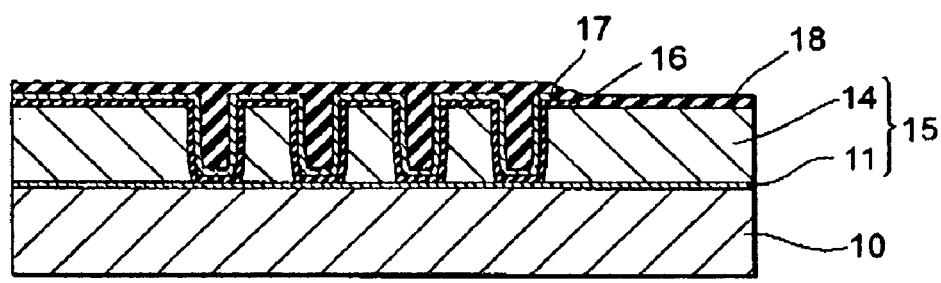
FIG. 31 is a cross-sectional view showing a state of fabricating the thin film capacitor 1.

Then, as shown in FIG. 31, the protection film 18 is formed on the entire top surface of the substrate 10 in the state shown in FIG. 30. The material for the protection film 18 is not particularly restrictive as long as it is an insulating material; for example, an inorganic material, such as $SiO_2$ or $Al_2O_3$, and an organic material, such as polyimide or epoxy, can be used. The thickness of the protection film 18 is neither particularly restrictive, and is set equal to or greater than 2 μm, for example.

Figure 32:
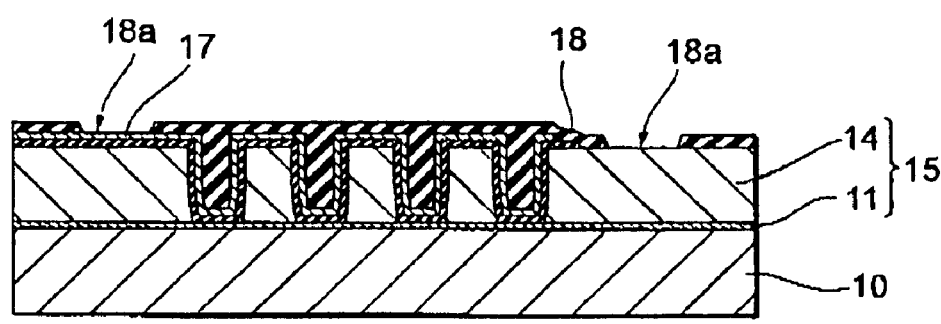
FIG. 32 is a cross-sectional view showing a state of fabricating the thin film capacitor 1.

Next, as shown in FIG. 32, the protection film 18 at the regions where the pad electrodes 19 are to be formed is removed to form the two openings 18a in the protection film 18 by photolithography-based patterning. As a result, the second metal layer 14 which constitutes a part of the lower electrode 15 is exposed at one end side (right side in the diagram) of the protection film 18, and the upper electrode 17 is exposed on the other end side (left side in the diagram).

Figure 33:
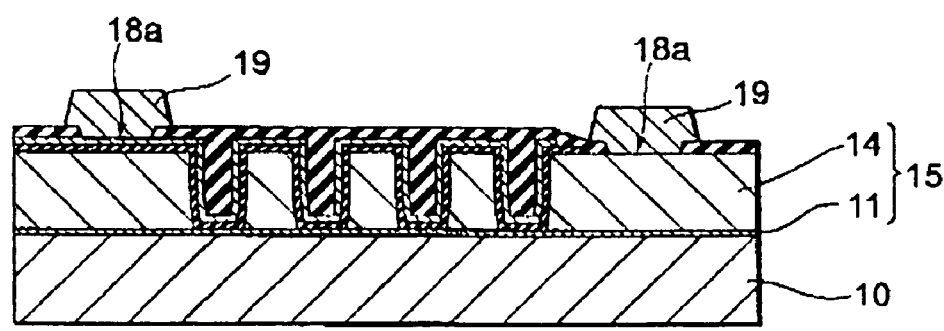
FIG. 33 is a cross-sectional view showing a state of fabricating the thin film capacitor 1.

Then, as shown in FIG. 33, an electrode film is formed on the entire top surface of the substrate 10 in the state shown in FIG. 32, and is patterned using photolithography to thereby form the pad electrodes 19, 19 in the respective openings 18a, 18a. Alternatively, a resist is formed in other regions than the openings 18a, 18a, the pad electrodes 19 are formed in the openings 18a by plating, and then the resist is removed. The material for the pad electrode 19 is not particularly restrictive, and Au, for example, can be used.

The fabrication method for the thin film capacitor 1 has an advantage over the subtractive method of forming the first pattern P1 and the second pattern P2 on the trench forming layer 100 by etching in that the first pattern P1 and the second pattern P2 which match the pattern of the resist layer 20 can be acquired and the precision of the shapes of the first pattern P1 and the second pattern P2 is high. It is to be noted however that while the pattern width of the resist layer 20 may slightly vary due to the influence of the developing process or the like, the thin film capacitor 1 of the present invention can ensure the uniformity of the capacitance in the surface of the substrate regardless of a variation in the pattern width of the resist layer 20 for an increase/decrease in the circumferential length of the protrusion 101 of the first pattern P1 can be canceled out with a decrease/increase in the circumferential length of the recess 102 of the second pattern P2 as mentioned above.

Although the foregoing description of the fabrication example 1 has been given of an example where a metal layer is buried twice (first metal layer 13 and second metal layer 14), the first metal layer 13 formed using the resist layer 20 may be used as the lower electrode 15. In this case, the pattern of the resist layer 20 should have an inverted relationship with that of the foregoing example.

Fabrication Example 2 of Thin Film Capacitor

One example of the fabrication method for the thin film capacitor 2 will be described below. FIGS. 34 to 39 are cross-sectional views showing states of fabricating the thin film capacitor 2 (process flow diagrams).

Figure 34:
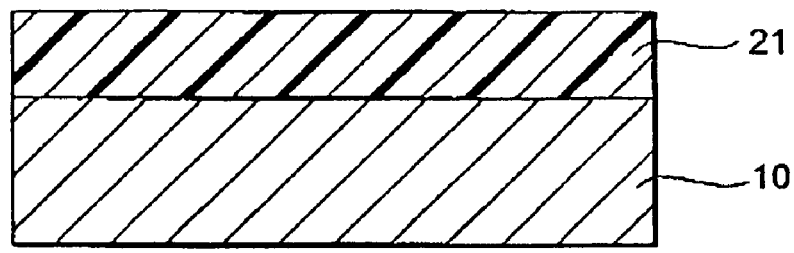
FIG. 34 is a cross-sectional view showing a state of fabricating a thin film capacitor 2.
Figure 35:
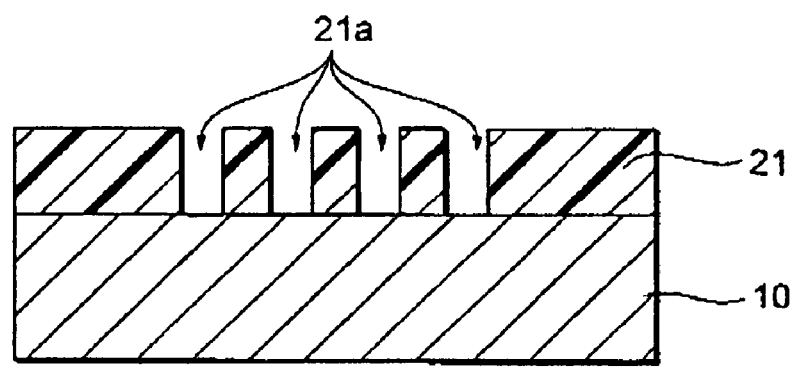
FIG. 35 is a cross-sectional view showing a state of fabricating the thin film capacitor 2.

First, as shown in FIG. 34, a resist layer 21 is formed on the top surface of the substrate 10. Then, as shown in FIG. 35, exposure and development of the resist layer 21 are carried out using a mask pattern of trenches to form openings 21a at portions where trenches are to be formed, thereby exposing the substrate 10 at the bottoms of the openings 21a. The pattern of the resist layer 21 is the same as the first pattern P1 and the second pattern P2 to be formed. That is, portions equivalent to the protrusions 101 of the first pattern P1 are left and portions equivalent to the recesses 102 of the second pattern P2 are made into the openings 21a.

Figure 36:
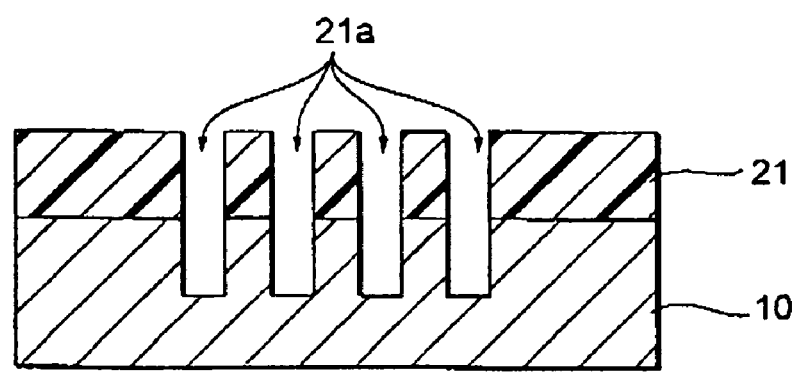
FIG. 36 is a cross-sectional view showing a state of fabricating the thin film capacitor 2.

Next, as shown in FIG. 36, the substrate 10 exposed in the openings of the resist layer 21 are dry-etched. From the viewpoint of forming trench with a high aspect ratio while suppressing side etching as much as possible, it is preferable to use anisotropic dry etching, such as RIE (Reactive Ion Etching). Note that etching is not limited to dry etching, and wet etching may be used as well.

Figure 37:
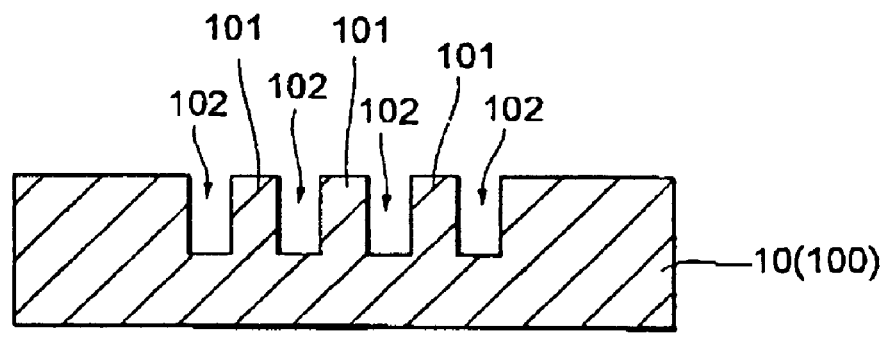
FIG. 37 is a cross-sectional view showing a state of fabricating the thin film capacitor 2.

Then, as shown in FIG. 37, the resist layer 21 is removed. As a result, the trench pattern defined by the first pattern P1 having the protrusions 101 and the second pattern P2 having the recesses 102 is formed on the substrate 10.

Figure 38:
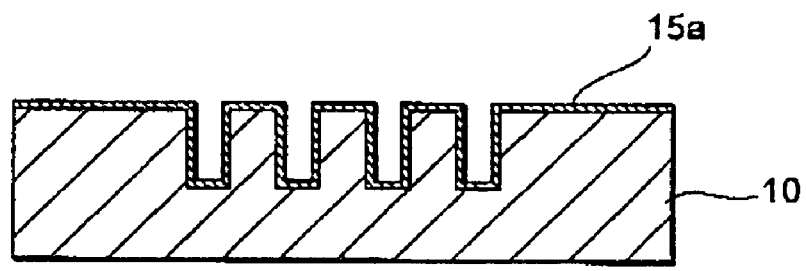
FIG. 38 is a cross-sectional view showing a state of fabricating the thin film capacitor 2.

Next, as shown in FIG. 38, an electrode film 15a for forming the lower electrode 15 is deposited on the entire top surface of the substrate 10. An example of the material for the electrode film 15a is the material for the lower electrode 15 which has been explained in the description of the fabrication example 1. As the electrode film 15a, for example, an Ni film can be formed by sputtering.

Figure 39:
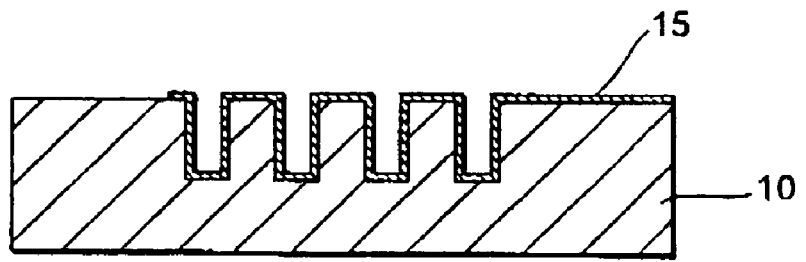
FIG. 39 is a cross-sectional view showing a state of fabricating the thin film capacitor 2.

Then, as shown in FIG. 39, a resist pattern is formed on the electrode film 15a by a photolithography process, and patterning is performed to locally etch the electrode film 15a using the resist pattern, thereby forming the lower electrode 15.

As subsequent processes, the dielectric film 16, the upper electrode 17, the protection film 18 and the pad electrodes 19 are formed in order on the lower electrode 15 in the manners described earlier, thereby yielding the thin film capacitor 2 shown in FIG. 5.

According to the fabrication method for the thin film capacitor 2, side etching may vary (spread) at the time of preparing a trench pattern by etching the surface of the substrate 10 (see FIG. 36). According to the thin film capacitor 2 of the present invention, however, the uniformity of the capacitance in the surface of the substrate can be achieved regardless of the amount of side etching for an increase/decrease in the circumferential length of the protrusion 101 of the first pattern P1 can be canceled out with a decrease/increase in the circumferential length of the recess 102 of the second pattern P2 as per the fabrication example 1.

For the fabrication method for the thin film capacitor 3 having the configurational example 3 shown in FIG. 6, after forming the insulating layer 12 on the substrate 10, the first pattern P1 and the second pattern P2 have only to be formed on the insulating layer 12 by dry etching. As subsequent processes, the lower electrode 15, the dielectric film 16, the upper electrode 17, the protection film 18 and the pad electrodes 19 are formed in manners similar to those of the fabrication example 2, thereby yielding the thin film capacitor 3 shown in FIG. 6. This fabrication method brings about an advantage that the depth of the trenches in the surface of the substrate 10 can be made constant by etching the insulating layer 12 using a condition that the etch rate for the insulating layer 12 becomes higher than that for the substrate 10. The insulating layer 12 which has the first pattern P1 and the second pattern P2 may be formed by adding an insulating layer only at desired regions using a resist, as per the fabrication example 1.

Further, as mentioned above, the present invention is not limited only to the embodiment, and but may be modified in various forms without departing from the spirit or scope of the invention. For example, while the number of the protrusions 101 of the first pattern P1 and the number of the recesses 102 of the second pattern P2 are not limited to the same number, it is desirable that the numbers should be the same from the viewpoint of suppressing a change in the circumferential length of the trench. Although the protrusion 101 and the recess 102 in the trench pattern shown in FIG. 8 are both illustrated to be squares, the protrusion 101 and the recess 102 can both be rectangles as in the trench pattern shown in FIG. 9, or are not limited to complete circles, and may be elliptical. In addition, the opposing sides of the protrusion 101 and the recess 102 may not be in parallel to each other, and a trench defined by both the protrusion 101 and the recess 102 may have a planar shape to provide a groove structure extending non-linearly in a predetermined direction like a curved pattern or a zigzagged pattern.

As described above, the fabrication method for the thin film capacitor of the present invention can fabricate a thin film capacitor which has an improve uniformity of the capacitance while keeping a high capacitance, and can therefore be effectively adapted to a variety of fabrication applications to various machines, apparatuses systems, devices and so forth, which incorporate thin film type electronic parts, and particularly, to those which are demanded to be down-sized and have enhanced performances.

The present application is based on Japanese priority application No. 2007-093765 filed on Mar. 30, 2007, the entire contents of which are hereby incorporated by reference.

What is claimed is:

1. A thin film capacitor comprising:
 a base substance;
 a first electrode provided on the base substance;
 a dielectric film provided on the first electrode; and
 a second electrode provided on the dielectric film;
 wherein the first electrode is patterned to have a first pattern and a second pattern, the patterns are isolated from each other;
 the first pattern is an aggregation of a plurality of protrusions separate from each other in a planar view; and
 the second pattern has a plurality of recesses separated from each other in the planar view and a beam for defining each recess, the beams being connected to each other from top to bottom.

2. The thin film capacitor according to claim 1, wherein the number of the protrusions of the first pattern is equal to the number of the recesses of the second pattern.

3. The thin film capacitor according to claim 1, wherein the protrusion of the first pattern is arranged in the recess of the second pattern in a nested form.

4. The thin film capacitor according to claim 1, wherein a planar shape of the protrusion of the first pattern is similar to a planar shape of the recess of the second pattern.

5. The thin film capacitor according to claim 1, wherein a planar shape of the protrusion of the first pattern and/or the recess of the second pattern extends in a lengthwise direction.

6. The thin film capacitor according to claim 1, wherein the protrusion of the first pattern or the recess of the second pattern fulfills a relationship given by a following equation (1):

$$L/S \geq 2 \qquad (1)$$

where
 L: length in a long axial direction, and
 S: length in a short axial direction.

7. The thin film capacitor according to claim 1, wherein a planar shape of the first pattern and/or the second pattern is a cross shape.

8. The thin film capacitor according to claim 1, wherein the protrusion of the first pattern and/or the recess of the second pattern is arranged in a zigzagged grid pattern.

* * * * *